US009897976B2

(12) United States Patent
Gao et al.

(10) Patent No.: US 9,897,976 B2
(45) Date of Patent: Feb. 20, 2018

(54) FRACTIONAL DIVIDER USING A CALIBRATED DIGITAL-TO-TIME CONVERTER

(71) Applicant: Integrated Device Technology, Inc., San Jose, CA (US)

(72) Inventors: Song Gao, Chandler, AZ (US); Brian Buell, Gilbert, AZ (US); Katherine T. Blinick, Chandler, AZ (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/479,499

(22) Filed: Apr. 5, 2017

(65) Prior Publication Data

US 2017/0364034 A1 Dec. 21, 2017

Related U.S. Application Data

(63) Continuation of application No. 15/185,378, filed on Jun. 17, 2016, now Pat. No. 9,678,481.

(51) Int. Cl.
*H03M 1/10* (2006.01)
*G04F 10/00* (2006.01)
*H03M 1/66* (2006.01)

(52) U.S. Cl.
CPC ........ *G04F 10/005* (2013.01); *H03M 1/1009* (2013.01); *H03M 1/66* (2013.01)

(58) Field of Classification Search
CPC ...... G04F 10/005; H03M 1/1009; H03M 1/66
USPC .......................................................... 341/120
See application file for complete search history.

(56) References Cited

U.S. PATENT DOCUMENTS

| 6,687,321 | B1* | 2/2004 | Kada ................ H03L 7/0997 327/158 |
|---|---|---|---|
| 8,860,514 | B2 | 10/2014 | Weltin-Wu ................ 331/143 |
| 8,976,053 | B1 | 3/2015 | Zhang ....................... 341/155 |
| 9,000,815 | B2* | 4/2015 | Romano ................. H03L 7/07 327/144 |
| 9,124,280 | B2 | 9/2015 | Kim |
| 9,285,778 | B1 | 3/2016 | Evans |
| 9,319,039 | B2* | 4/2016 | Roytman ............... H03K 5/26 |
| 9,397,823 | B2* | 7/2016 | Zerbe ................ H03K 5/1252 |
| 9,678,481 | B1* | 6/2017 | Gao ................... G04F 10/005 |

* cited by examiner

*Primary Examiner* — Brian Young
(74) *Attorney, Agent, or Firm* — Christopher P. Maiorana, PC

(57) ABSTRACT

An apparatus comprising a first circuit and a second circuit. The first circuit may be configured to generate a divided clock signal and a control signal in response to (i) an input clock signal and (ii) a configuration signal. The second circuit may be configured to generate an output clock signal in response to (i) the control signal and (ii) the divided clock signal. The second circuit may add a delay to one or more edges of the output clock signal by engaging one or more of a plurality of capacitances. A number of the capacitances engaged may be selected to reduce jitter on the output clock signal. The capacitances may be used each cycle to calibrate the output clock signal.

18 Claims, 8 Drawing Sheets

US 9,897,976 B2

FRACTIONAL DIVIDER USING A CALIBRATED DIGITAL-TO-TIME CONVERTER

This application relates to U.S. Ser. No. 15/185,378, filed Jun. 17, 2016, which is incorporated by reference in its entirety.

FIELD OF THE INVENTION

The invention relates to clock generation circuits generally and, more particularly, to a method and/or apparatus for implementing a fractional divider using a calibrated digital-to-time converter.

BACKGROUND

Fractional dividers can replace Fractional-N Phase Locked Loops (PLLs). Fractional dividers provide power, die size, and transient advantages over conventional PLLs. Conventional fractional dividers typically use a phase interpolator to reduce jitter. A phase interpolator has a relatively stable full-scale phase delay, but suffers from poor linearity and tends to introduce spurs. Attempts to calibrate and linearize phase interpolators have been difficult to implement.

Another conventional solution implements a jitter attenuating PLL. Such approaches have drawbacks such as needing large die sizes to implement. Such approaches tend to use high power.

It would be desirable to implement a fractional divider using a calibrated digital-to-time converter.

SUMMARY

The invention concerns an apparatus comprising a first circuit and a second circuit. The first circuit may be configured to generate a divided clock signal and a control signal in response to (i) an input clock signal and (ii) a configuration signal. The second circuit may be configured to generate an output clock signal in response to (i) the control signal and (ii) the divided clock signal. The second circuit may add a delay to one or more edges of the output clock signal by engaging one or more of a plurality of capacitances. A number of the capacitances engaged may be selected to reduce jitter on the output clock signal. The capacitances may be used each cycle to calibrate the output clock signal.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a fractional divider that may (i) use a calibrated digital-to-time converter, (ii) be generated with a single, low power and/or low cost device, (iii) implement independent clock signals that have minimal coupling to each other, and/or (iv) be implemented as one or more integrated circuits.

Figure 1:
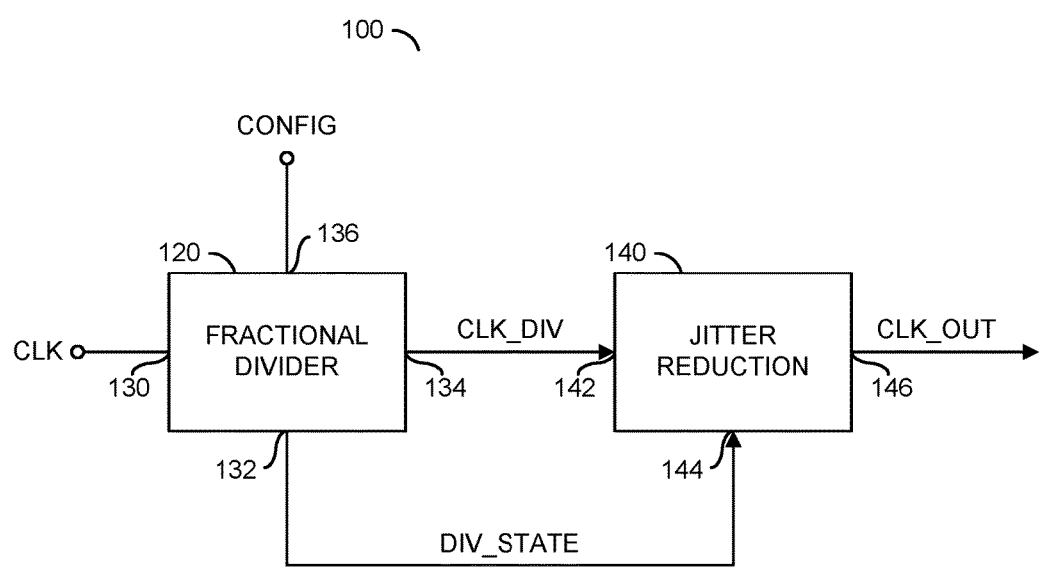
FIG. 1 is a block diagram of an embodiment of the invention.

Referring to FIG. 1, a circuit 100 is shown in accordance with an embodiment of the invention. The circuit 100 may be implemented as a fractional divider using a calibrated digital-to-time converter (e.g., to provide jitter reduction). The circuit 100 generally comprises a block (or circuit) 120, and a block (or circuit) 140. The circuit 120 may be implemented as a fractional divider circuit. The circuit 140 may be implemented as a jitter reduction circuit.

The circuit 120 may have an input 130, an output 132, an output 134, and an input 136. The input 130 may receive a signal (e.g., CLK). The signal CLK may be implemented as an input clock signal. The output 132 may present a signal (e.g., DIV_STATE). The signal DIV_STATE may be a divider control signal. The signal DIV_STATE may provide information to the circuit 140 in addition to an integer divide value used by the circuit 120. The output 134 may present a signal (e.g., CLK_DIV). The signal CLK_DIV may be a divided clock signal. The input 136 may receive a signal (e.g., CONFIG). The signal CONFIG may set an amount of clock division (e.g., an integer divide value and/or a fractional divide value) implemented by the fractional divider circuit 120.

The circuit 140 may have an input 142, an input 144 and an output 146. The input 142 may receive the signal CLK_DIV. The input 144 may receive the signal DIV_STATE. The output 146 may present a signal (e.g., CLK_OUT). The signal CLK_OUT may be an output clock signal. The signal DIV_STATE may be used by one or more components of the circuit 140 to calibrate the output clock signal CLK_OUT.

The signal CONFIG may configure the amount of the fractional division. The signal CONFIG may be supplied by a memory, may be a fixed value, may be a dynamically changing value, and/or may otherwise be supplied by a device or user external to the circuit 100. The fractional divider circuit 120 may provide an initial division. The jitter reduction circuit 140 may provide additional conditioning (e.g., jitter reduction, etc.) on the signal CLK_DIV while generating the signal CLK_OUT. The signal CLK_OUT is generally a jitter corrected signal.

Figure 2:
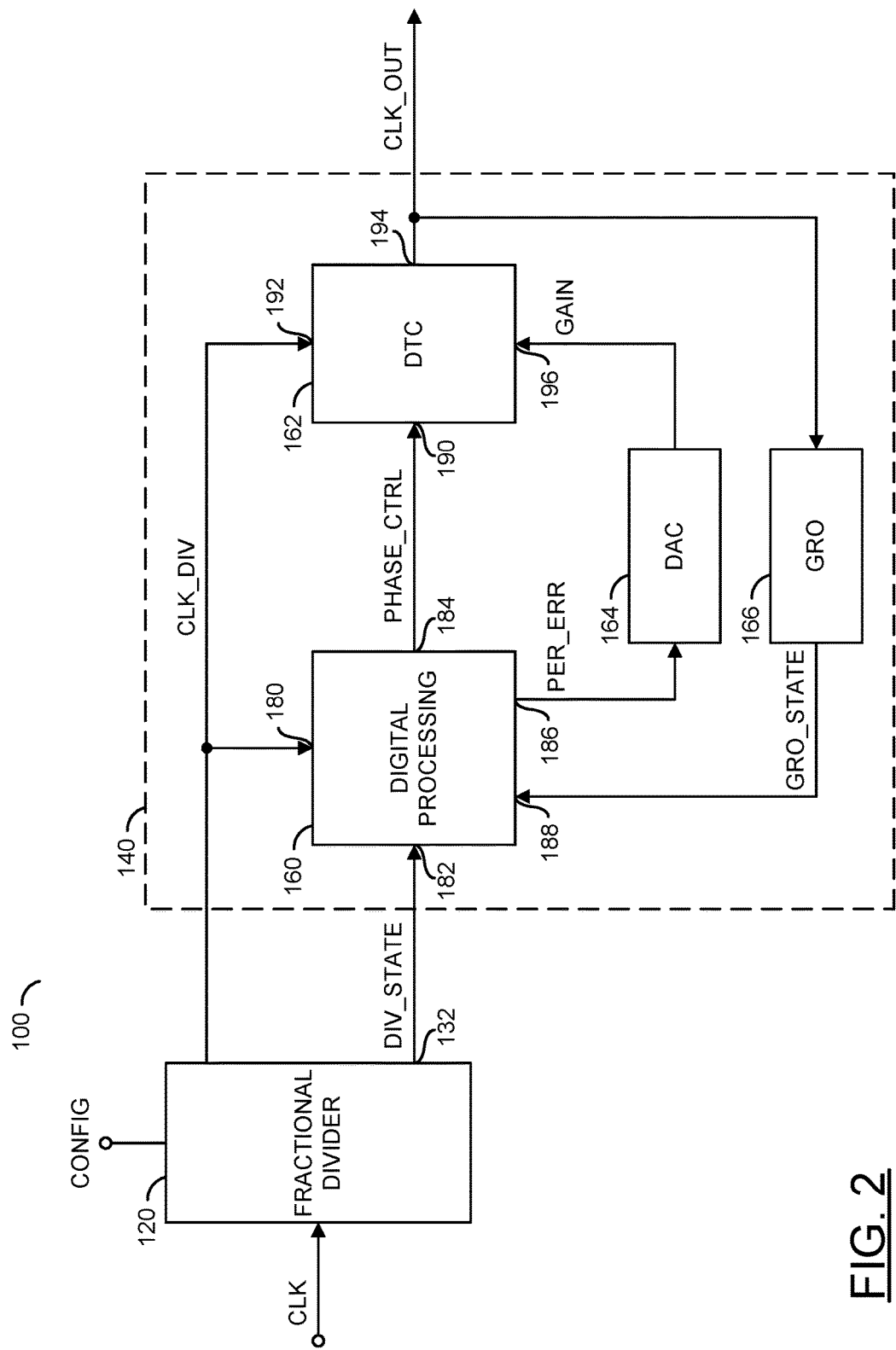
FIG. 2 is a more detailed block diagram of the embodiment of FIG. 1.

Referring to FIG. 2, a more detailed block diagram of the circuit 100 is shown. Additional details of the circuit 140 are shown. The circuit 140 generally comprises a block (or circuit) 160, a block (or circuit) 162, a block (or circuit) 164 and a block (or circuit) 166. The circuit 160 may be implemented as a digital processing circuit. The circuit 162 may be implemented as a digital-to-time converter (DTC) circuit. The circuit 164 may be implemented as a digital-to-analog converter (DAC) circuit. The circuit 166 may be implemented as a gated ring oscillator (GRO) circuit. The particular implementation of the circuit 162, the circuit 164 and/or the circuit 166 may be varied to meet the design criteria of a particular implementation.

The circuit 160 may have an input 180, an input 182, an output 184, an output 186, and an input 188. The input 180 may receive the signal CLK_DIV. The input 182 may receive the signal DIV_STATE. The output 184 may present a signal (e.g., PHASE_CTRL). The output 186 may present a signal (e.g., PER_ERR). The signal PER_ERR may be a filtered and/or digitally processed version of a period error signal. The period error may be considered an instantaneous deterministic period deviation. The input 188 may receive a signal (e.g., GRO_STATE). In some embodiments, the circuit 160 may be implemented as a digital block that is clocked from the signal CLK_DIV. In some embodiments, the circuit 160 may be implemented as a digital block that is clocked from a signal derived from the signal CLK_DIV (e.g., a delayed version of the signal CLK_DIV, a divided-by-2 version of the signal CLK_DIV, etc.).

The circuit 162 may have an input 190, an input 192, an output 194, and an input 196. The input 190 may receive the signal PHASE_CTRL. The input 192 may receive the signal CLK_DIV. The output 194 may present the signal CLK_OUT. The input 196 may receive a signal (e.g., GAIN). The circuit 162 may be a control circuit. In some embodiments, the circuit 162 may be implemented as an analog component configured to receive the signal CLK_DIV and add an amount of delay to the signal CLK_DIV to generate the signal CLK_OUT.

The circuit 164 may generate the signal GAIN in response to the signal PER_ERR. The circuit 166 may generate the signal GRO_STATE in response to the signal CLK_OUT. The circuit 164 may be configured to provide feedback to the circuit 162. Other signals, inputs/outputs and/or components may be implemented.

The signal PHASE_CTRL may be implemented as a digital signal that may be used to control a capacitor bank (to be described in more detail in connection with FIG. 4). In an example, the signal PHASE_CTRL may be a 9-bit digital signal. However, other values (or bit widths) may be implemented to meet the design criteria of a particular implementation. For example, the bit width of the signal PHASE_CTRL may depend on the number of capacitors implemented. In the case of a 9-bit signal, the signal PHASE_CTRL may control 512 capacitors. The particular number of capacitors may be varied to meet the design criteria of a particular implementation. In general, the greater the number of capacitors implemented, the finer the jitter control that may be achieved. However, the greater the number of capacitors implemented, the higher the complexity of the circuit 100. The value of 512 capacitors may be a compromise between sufficient jitter control and the complexity of the circuit 100. In another example, 560 capacitors may be implemented and a 10-bit signal PHASE_CTRL may be implemented to control the 560 capacitors. In yet another example, 574 capacitors may be implemented using 26 control lines. Implementing 574 capacitors may be a variation on the binary value of 512. Other variations and/or binary values may be implemented according to the design criteria of a particular implementation.

Figure 3:
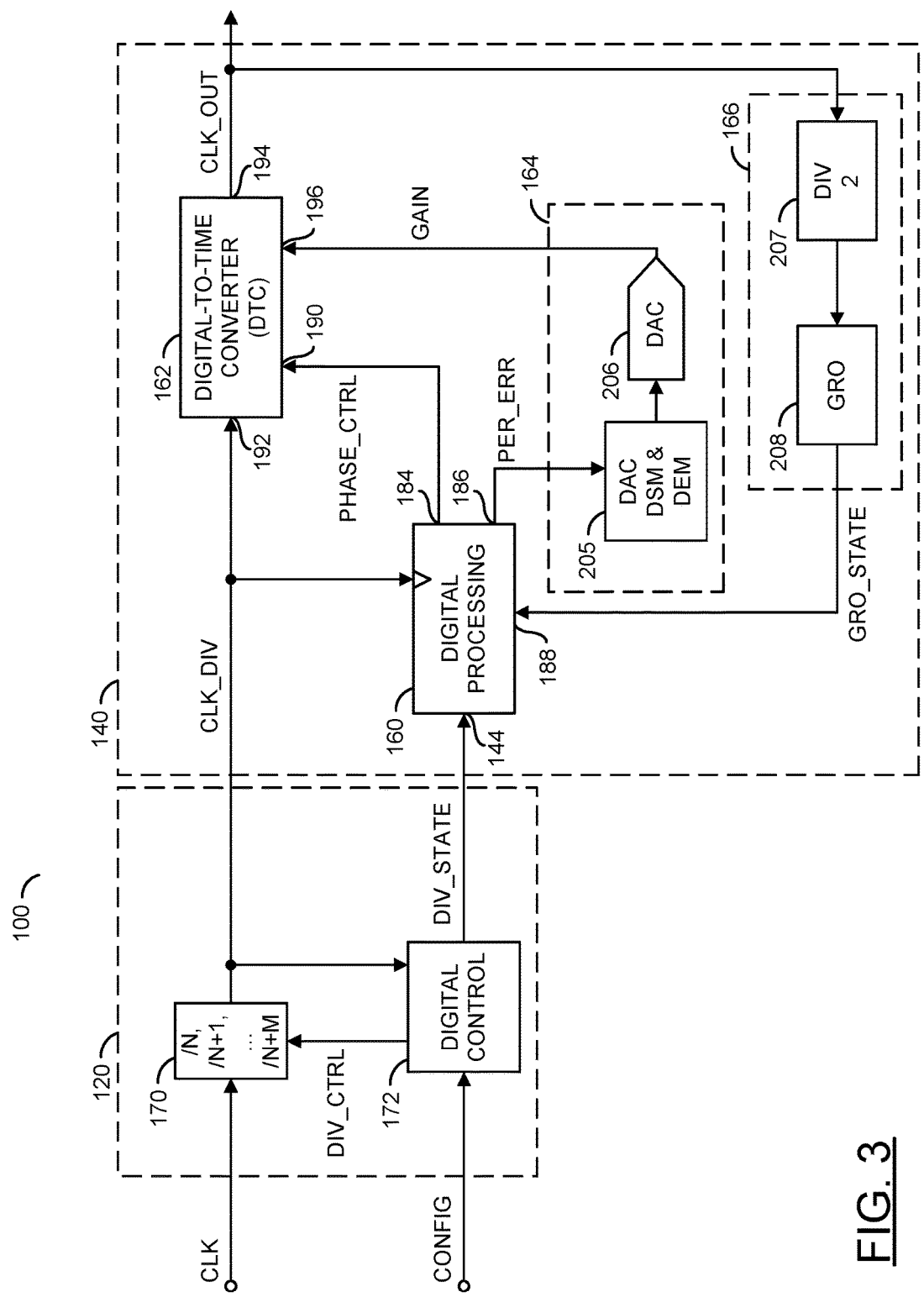
FIG. 3 is a more detailed diagram of the embodiment of FIG. 2.

Referring to FIG. 3, a more detailed diagram of the circuit 100 is shown. Additional details of the circuit 120 and/or additional components and/or alternate implementations of the circuit 140 are shown. The circuit 120 may comprise a block (or circuit) 170 and a block (or circuit) 172. The circuit 170 may be implemented as a divider circuit. In an example implementation, the circuit 170 may be implemented as a multi-modulus divider circuit. The circuit 172 may be implemented as a digital control circuit. The circuit 172 may implement a delta-sigma modulator to achieve a particular average division ratio. The circuit 172 may generate a signal (e.g., DIV_CTRL) and/or the signal DIV_STATE in response to the signal CLK_DIV and the signal CONFIG. The circuit 170 may generate the signal CLK_DIV in response to the signal DIV_CTRL and the signal CLK. The signal CONFIG may be an integer value and/or a fractional value that may control a fractional divide value generated by the circuit 120. In response to a selection provided in the signal DIV_CTRL, circuitry of the circuit 170 may be configured to switch to any one of a divide by N, a divide by N+1, a divide by N+2, etc. In some embodiments, the circuit 172 may be implemented as a digital block that is clocked from the signal CLK_DIV. In some embodiments, the circuit 172 may be implemented as a digital block that is from a signal derived from the signal CLK_DIV (e.g., a delayed version of the signal CLK_DIV, a divided-by-2 version of the signal CLK_DIV, etc.).

The circuit 164 may be implemented as a block (or circuit) 205 and a block (or circuit) 206. The circuit 205 may be implemented as a digital state machine (DSM). The circuit 206 may be implemented as a digital-to-analog converter circuit. The circuit 205 may be an optional implementation used to control the DAC circuit 206. In some embodiments, the circuit 205 may implement a dynamic-element-matching circuit. In some embodiments, the circuit 205 may implement a delta-sigma modulation. In an example implementation, the DAC circuit 206 may respond directly to the signal PER_ERR.

The circuit 166 may be implemented as a block (or circuit) 207 and a block (or circuit) 208. The circuit 207 may be implemented as a divider circuit. The circuit 208 may be implemented as a gated ring oscillator. The circuit 166 may be implemented to generate the signal GRO_STATE. In the example shown, the divider circuit 207 may be a divide by 2 circuit. The particular divide ratio implemented by the circuit 207 may be varied to meet the design criteria of a particular implementation. In an example implementation, the circuit 166 may be implemented without the circuit 207. The circuit 208 may be used to measure jitter on the signal CLK_OUT. Other measurement techniques may be implemented to meet the design criteria of a particular implementation.

Figure 4:
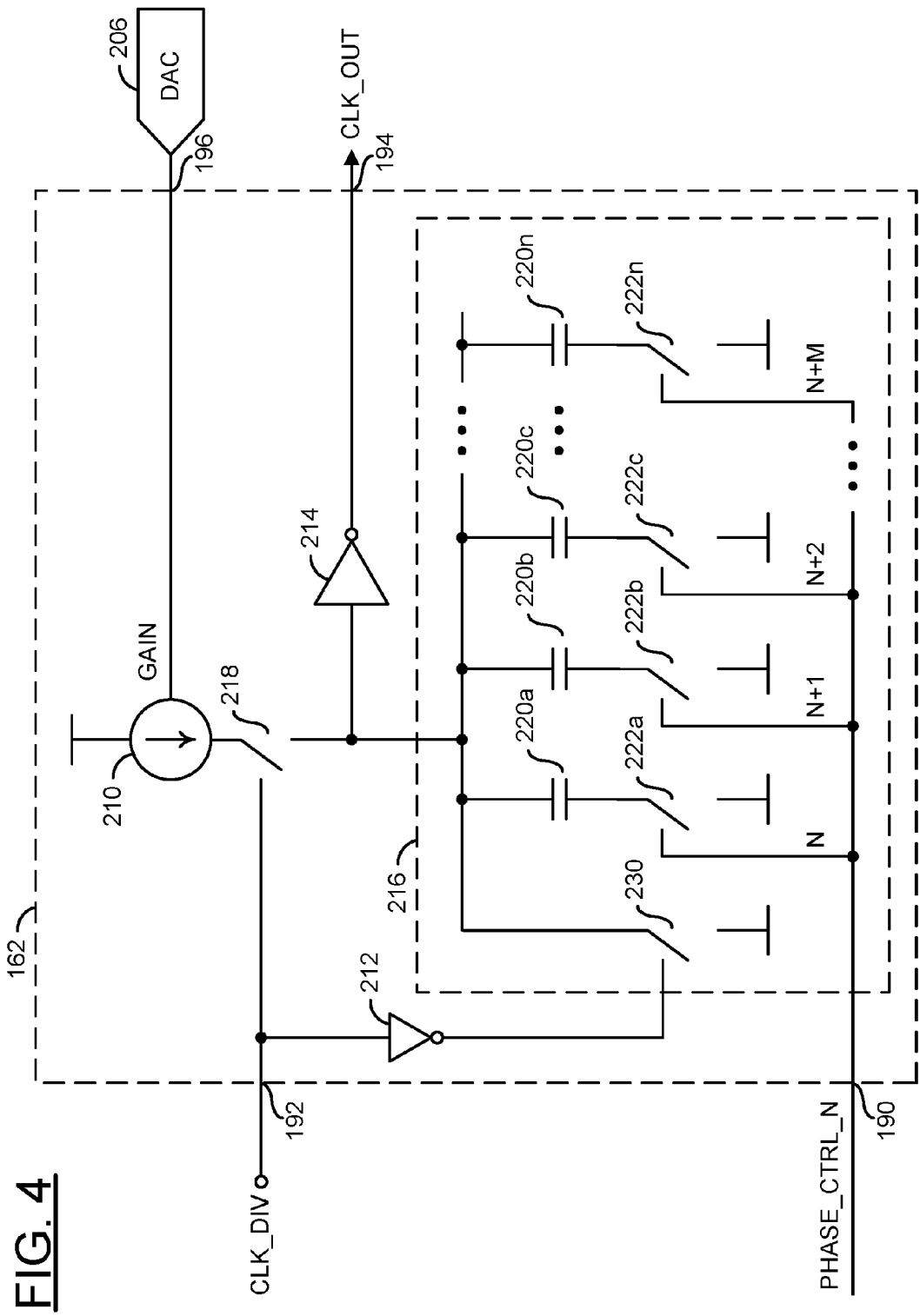
FIG. 4 is a diagram of the digital-to-time converter circuit of FIG. 1.

Referring to FIG. 4, a more detailed diagram of the digital-to-time converter circuit 162 is shown. The circuit 162 generally comprises a circuit 210, a circuit 212, a circuit 214, a circuit 216 and a circuit 218. The circuit 210 may be implemented as a current source that may be controlled by the signal GAIN. The signal GAIN may provide feedback to the circuit 162. The circuit 212 and/or the circuit 214 may be implemented as an inverter circuit. The circuit 216 may be implemented as a capacitor bank circuit. The circuit 218 may be implemented as a switch.

The capacitor bank circuit 216 generally comprises a number of capacitors 220a-220n, a number of switches 222a-222n and/or a switch 230. The particular number of capacitors 220a-220n may be varied to meet the design criteria of a particular implementation. The capacitors 220a-220n may be implemented as analog delay elements. Each of the capacitors 220a-220n may be connected between the switch 218 and ground. The switch 218 and the switch 230 may each receive the signals CLK_DIV. The inverter 212 may invert the signal presented to the switch 230. Either the switch 218 or the switch 230 is generally on at any clock cycle of the signal CLK_DIV. The switch 218 generally alternates with the switch 230 to engage or disengage the capacitor bank 216. With such an arrangement, the capacitor bank 216 provides a delay on only a portion of the total period of the signal CLK_OUT. For example, the capacitor bank 216 may provide a controlled delay on at least one edge of the signal CLK_OUT. The signal PHASE_CTRL may be quickly updated (e.g., each period) to provide the jitter correction on the signal CLK_OUT.

In an example, when the signal CLK_DIV is "high" for 2 cycles of the signal CLK (not shown) and low for several cycles of the signal CLK, the switches 218 and 230 would alternate between being "open" and "closed". For example, during the 2 cycles that the signal CLK_DIV is high, the switch 218 would be open, and the switch 230 would be closed. When the switch 218 opens and the switch 230 is closed, a "reset" time may be implemented (e.g., when all the capacitors 220a-220n are shorted to GND). When the signal CLK_DIV transitions low, the switch 230 opens and the switch 218 closes. When the switch 230 opens and the switch 218 closes, the input voltage of the inverter 214 may increase at a rate that is related to the signal PHASE_CTRL (e.g., to control and/or select the number of the capacitors 220a-220n that are engaged (e.g., switched on)) and the signal GAIN (e.g., to control the strength of the current source 210).

In an example implementation, the signal CLK_DIV may have a particular duty cycle. In an example, the signal CLK_DIV may be high for two cycles of the signal CLK, then low for the remaining cycles. In a divide by 10 implementation, such an implementation of the signal CLK_DIV would provide a 20% duty cycle.

In an example implementation, the capacitor bank 216 may implement a range of approximately 256-1024 of the capacitors 220a-220n. In an example implementation, the capacitors 220a-220n may not necessarily be fixed capacitors connected in series with the switches 222a-222n. Instead, the capacitors 220a-220n may be implemented as varactors (or analog delay elements). Each of the varactors may be digitally controlled to change between a high capacitance and a low capacitance state based on the state of one of the bits of the signal PHASE_CTRL. The signal PHASE_CTRL is shown as a multi-bit signal (e.g., PHASE_CTRL_N). In one example, each bit of the signal PHASE_CTRL_N may be used to control one of the capacitors (or varactors) 220a-220n. In another example, each bit in the signal PHASE_CTRL_N may control multiple capacitors (or varactors) 220a-220n (e.g., arranged in a binary weighted control scheme). The bit N is shown controlling the capacitor/varactor 220a via the switch 222a. The bit N+1 is shown controlling the capacitor/varactor 220b via the switch 222b.

The calibration of the capacitor bank 216 may be implemented by measuring the cycle-to-cycle jitter on the signal CLK_OUT. Such a measurement may be implemented by the circuit 166 (e.g., the gated ring oscillator 208 and the divider circuit 207). If the calibration is accurate, jitter may be substantially reduced on the output signal CLK_OUT. If some jitter is measured on the output signal CLK_OUT, an extraction may be made from the jitter (e.g., based on whether the delay curve should have a higher slope or a lower slope). The adjustment may be calculated digitally and then sent to the DAC circuit 206. The output voltage of the DAC circuit 206 may be used to control the strength of the circuit 210 that is driving the capacitor array 216. The amount of adjustment (e.g., delay) needed to reduce jitter may change for each clock cycle (e.g., based on the signal PHASE_CTRL).

Figure 5:
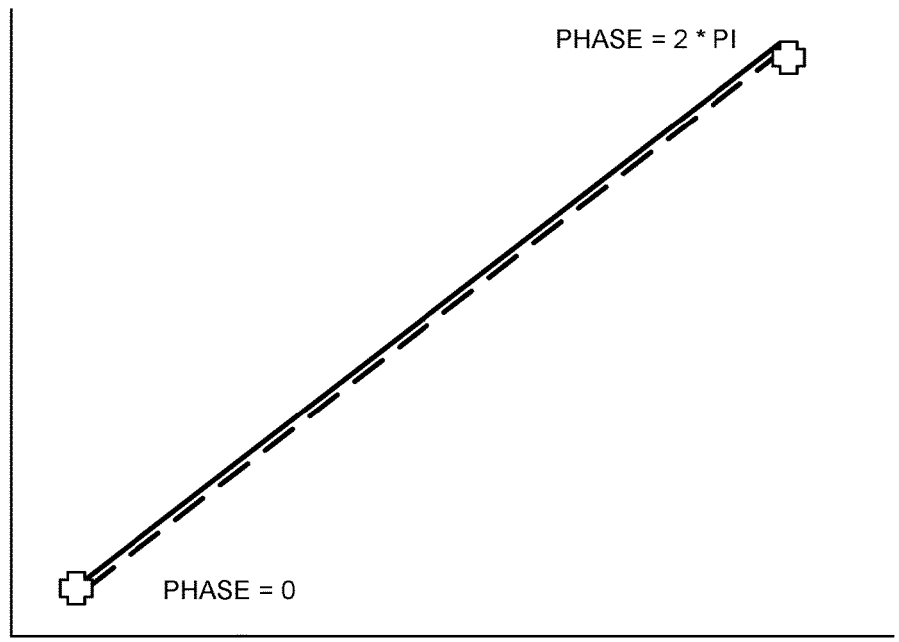
FIG. 5 is a diagram illustrating a linear output.

Referring to FIG. 5, a block diagram of a calibrated waveform is shown. When mismatched, the capacitors 220a-220n may be linearized using DEM/scrambling techniques. The gain is generally calibrated as a single parameter. The calibration may be implemented regularly (or even continuously) in the background. In an example implementation, the calibrations may occur during each period of the signal CLK_OUT.

An update to the phase is shown on each cycle. Without the correction provided by the apparatus 100, the clock cycle would either be divide by N, or divide by N+1 from the divider circuit 170. In an example where a 10.25 ratio of division is selected (e.g., by the signal CONFIG), three cycles of divide by 10 may be implemented, followed by one cycle of divide by 11. In order to reduce jitter, after each of the divide by 10 periods, 0.25 of a period of delay may be presented through the capacitor bank 216. By providing such a delay on the divide by 10, each of the four periods would be equal when viewed over time. In the example of a 10 gigahertz clock, 1ns may be implemented followed by 1.1 ns. Therefore, 100 ps of jitter may result. By implementing eight 0.25 periods of delay, the overall jitter may be reduced. The number of capacitors 220a-220n may be selected so that when none (e.g., zero) of the capacitors 220a-220n are engaged, a minimal delay would be implemented. When all (e.g., a total number) of the capacitors 220a-220n are engaged, a delay of at least a full period of the signal CLK (e.g., a 10 GHz) may be implemented.

Figure 6:
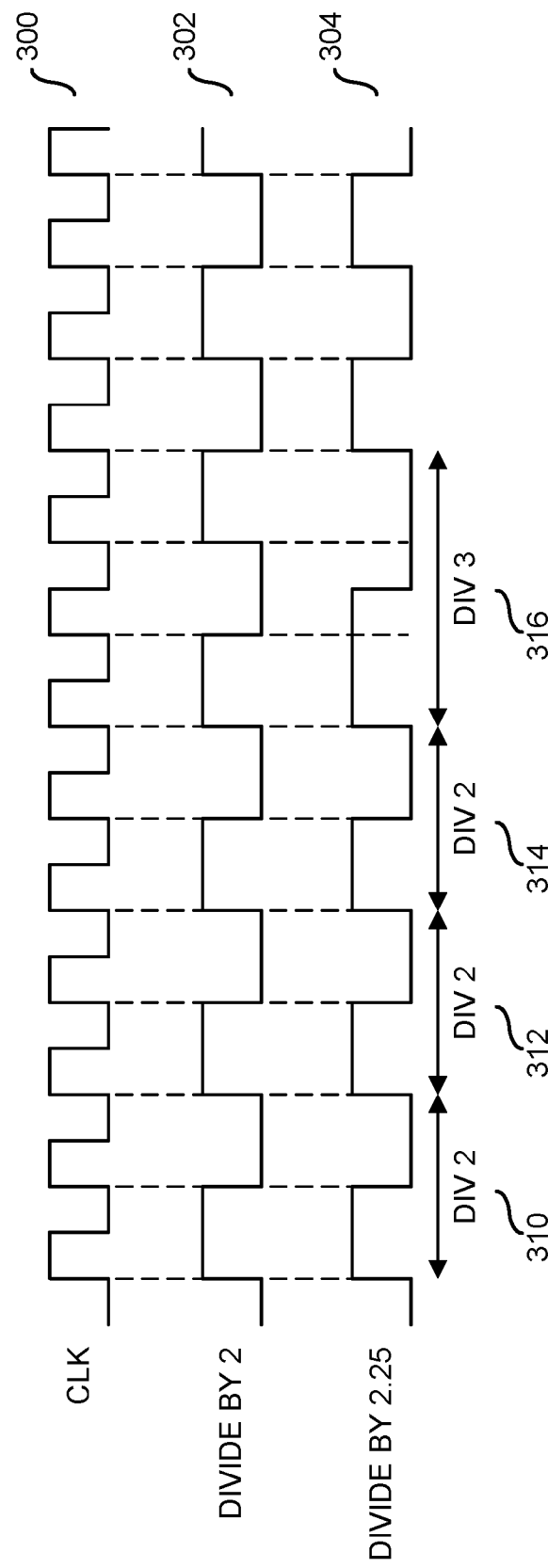
FIG. 6 is a timing diagram of a divide by 2.25 waveform illustrating jitter.

Referring to FIG. 6, a timing diagram is shown. The signal CLK is shown as a waveform 300. A divide by 2 waveform 302 is shown. The rising edge of the waveform 302 generally occurs on every second rising edge of the waveform 300 (e.g., first, third fifth, etc.). Similarly, the falling edge of the waveform 302 generally occurs on every second rising edge of the waveform 300 (e.g., second, fourth, sixth, etc.). A waveform 304 is shown implementing a divide by 2.25 signal based on using only the rising and falling edges of the waveform 302. A portion 310, 312, 314 and 316 are shown. The portions 310, 312 and 314 are generally a divide by two portion. The portion 316 may be a divide by three portion. Therefore, the waveform 304 shows jitter, with some of the rising edges and falling edges (or periods) occurring having different sizes. In the example shown, the divide-by-2.25 signal 304 may have an average divide value of 2.25, but the instantaneous divide value is either 2 or 3. The resulting divided signal has jitter.

Figure 7:
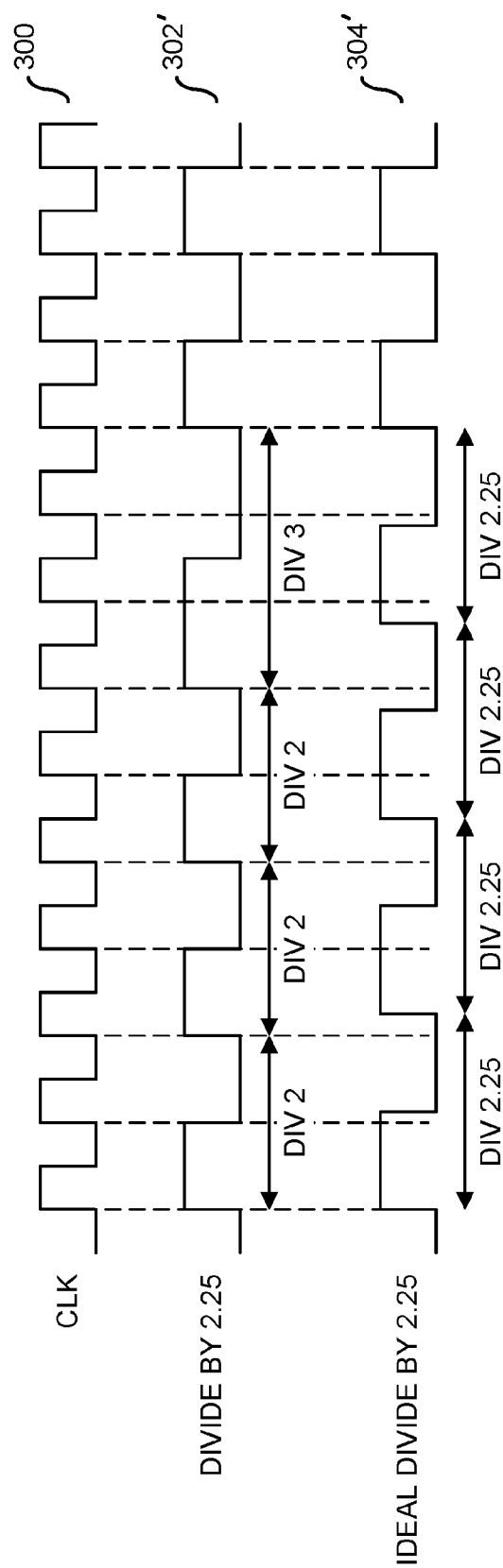
FIG. 7 is a timing diagram illustrating a target divide by 2.25 waveform without referencing an edge of a reference clock signal.

Referring to FIG. 7, a timing diagram is shown illustrating an alternate divide by 2.25 clock waveform 304'. The waveform 304' illustrates an ideal waveform. However, the rising and falling edges of the waveform 304' often do not correspond to a rising or falling edge of the divide by 2.25 clock 302' and/or the signal CLK 300. The periods are not all the same. The ideal divide-by-2.25 waveform 304' is shown as an example, but may not be generated with simple digital logic (e.g., the transitions would need to occur at times that do not correspond with a transition of the high speed clock edge of the waveform 300).

Figure 8:
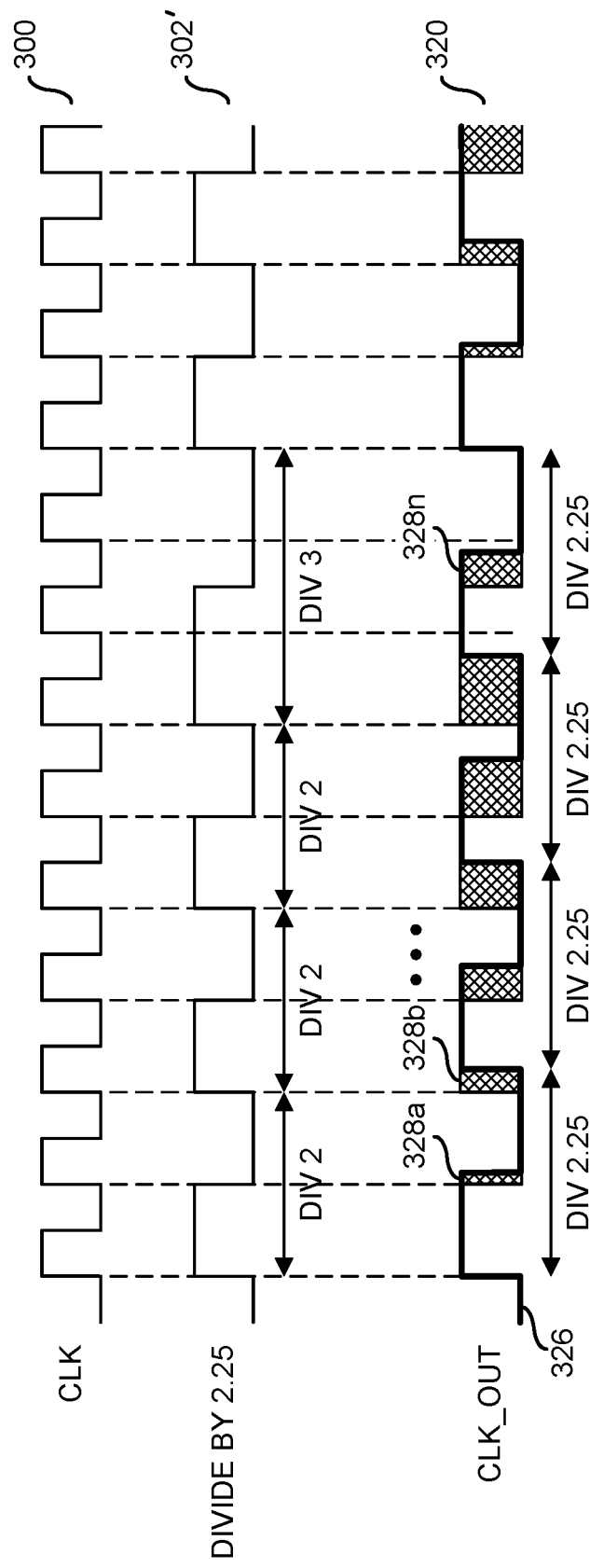
FIG. 8 is a timing diagram illustrating jitter reduction using calibrated delays.

Referring to FIG. 8, a diagram illustrating a waveform 320 (e.g., the signal CLK_OUT) is shown. The waveform 320 uses the delay associated with the capacitor bank 216 to generate an output similar to the ideal divide by 2.25 clock signal 304' (shown in FIG. 7). The difference between the ideal divide-by 2.25 waveform 304' and the digital logic achievable divide-by-2.25 waveform 302' is shown by a number of delays 328a-328n of the waveform 320 (e.g., the signal CLK_OUT).

Analog delay elements may be designed to create the delay in the delay boxes 328a-328n. The delay may need to be accurate over various operating conditions. The target delay (e.g., represented as the width of the boxes 328a-328n)

may be controlled with digital circuitry and/or may change every cycle of the signal CLK_OUT. The circuit 100 may generate the dynamic delays 328a-328n and/or continuously calibrate the delays 328a-328n to target values (e.g., for each cycle of the signal CLK_OUT).

In operation, the circuit 100 may control a digitally controlled delay cell (e.g., the DTC circuit 162). The DTC circuit 162 may be controlled and/or calibrated to be highly linear using common design techniques. A time to digital converter circuit may be implemented to measure the phase corrected fractional divider output jitter signal CLK_OUT. In an example embodiment, the gated ring oscillator (GRO) 166 may be used as a time to digital converter circuit to provide a feedback (e.g., the signal GRO_STATE). In some embodiments, another type of measurement circuit may be used to perform a cycle-to-cycle comparison of the signal CLK_OUT to generate the signal GRO_STATE. The output signal GRO_STATE of the circuit 166 may be processed and/or filtered digitally (e.g., by the digital processing circuit 160). The digitally processed signal (e.g., PHASE_CTRL) may be used to calibrate the full scale phase of the DTC circuit 162 in a manner that reduces the output jitter from the fractional divider circuit 120 by presenting the signal CLK_OUT.

The circuit 140 may be a linear delay block that may be used to reduce jitter. The jitter of the fractional divider circuit 120 may be measured with the circuit 166. The result of the measurement may be processed digitally by the circuit 160 and/or the circuit 164. The result may be applied to the circuit 162 to reduce the jitter on the signal CLK_OUT. In some embodiments, the delay circuit 140 may use DEM techniques (e.g., performed by the circuit 205) to implement a linear output clock signal CLK_OUT. The circuit 140 may use the GRO circuit 208 for high accuracy and/or lower power and/or complexity. The digital signal GAIN may be applied to the DTC circuit 162 through the DAC circuit 206. The DAC circuit 206 may be implemented as a high resolution circuit. The signal GRO_STATE may be processed by the digital processing circuit 160 on cycles that maximize the signal to noise (SNR) of the clock signal CLK_OUT that is used as an input for the GRO circuit 208.

In some embodiments, the capacitances 220a-220n may be linearized using DEM/scrambling techniques. In an example, the DEM/scrambling techniques may be performed by the circuit 205. The signal GAIN may be calibrated. The signal GAIN may be a single parameter that may be calibrated continuously (e.g., on a per cycle basis) in the background. The GRO circuit 166 may be enabled for consecutive DTC-corrected periods. The digital process circuit 160 may compare the results from the GRO circuit 166 (e.g., the signal GRO_STATE) that occur around a DSM overflow (e.g., a state change from /N to /N+1 or from /N+1 to /N by the divider circuit 170). The digital circuit 160 may process the results and/or drive the DAC 206 to control DTC gain.

The comparisons and/or measurements by the GRO circuit 166 may be made on a "cycle-to-cycle" basis. Slow changes in oscillator frequency (e.g., due to flicker noise, temperature, supply voltage, etc.) may be rejected. The GRO circuit 166 may send a state value (e.g., the signal GRO_STATE) to the digital processing circuit 160. The digital processing circuit 160 may convert the state value to a phase value (e.g., the signal PHASE_CTRL). The phase control signal PHASE_CTRL (and a previous phase value of the signal PHASE_CTRL) may be used to calculate a period value for the clock pulse width. The period value may be implemented as a feedback signal to the circuit 162. When a DSM overflow occurs, the cycles where the divider 170 changes to N or N+1 (and the previous cycle) are compared to generate a period error value (e.g., the signal PER_ERR) of +1/−1 (or 0 if they are the same). The period error signal PER_ERR may be passed through a series of filters and/or the DSM circuit 205 and then passed to the DAC circuit 206 to either increase or decrease the value of the signal GAIN to the DTC value. The DTC gain calibrates and/or settles to a value which reduces jitter in the system.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

While the invention has been particularly shown and described with reference to embodiments thereof, it will be understood by those skilled in the art that various changes in form and details may be made without departing from the scope of the invention.

The invention claimed is:

1. An apparatus comprising:
a first control circuit (i) comprising a plurality of capacitances and (ii) configured to generate an output clock signal in response to a divided clock signal, a first feedback signal and a second feedback signal;
a second control circuit configured to generate said first feedback signal and an error signal in response to said divided clock signal and a state signal;
a first feedback circuit configured to generate said state signal in response to said output clock signal; and
a second feedback circuit configured to generate said second feedback signal in response to said error signal, wherein (i) one or more of said capacitances are engaged to add a delay to one or more edges of said output clock signal, (ii) a number of said capacitances engaged is selected to reduce jitter on said output clock signal, and (iii) said capacitances are used each cycle to calibrate said output clock signal.

2. The apparatus according to claim 1, wherein at least one period of delay is added when said number of said capacitances engaged is a total number of said capacitances available.

3. The apparatus according to claim 1, wherein a minimal amount of delay is added when said number of said capacitances engaged is zero.

4. The apparatus according to claim 1, wherein (i) said first feedback signal is used to select said number of said capacitances engaged and (ii) said first feedback signal is calibrated during each period of said output clock signal.

5. The apparatus according to claim 1, wherein said capacitances comprise a plurality of digitally controlled varactors.

6. The apparatus according to claim 1, wherein (i) a total number of said capacitances available is 512 and (ii) a 9-bit signal is implemented to select said number of said capacitances engaged.

7. The apparatus according to claim 1, wherein (i) a total number of said capacitances available is 560 and (ii) a 10-bit signal is implemented to select said number of said capacitances engaged.

8. The apparatus according to claim 1, wherein (i) said second control circuit is configured to convert said state signal to a phase value, (ii) said phase value and a previous phase value are used to calculate a period value for a clock pulse width and (iii) said period value is used as said first feedback signal.

9. The apparatus according to claim 1, wherein said second control circuit is configured to generate said error signal in response to a delta-sigma modulation (DSM) overflow.

10. The apparatus according to claim 9, wherein said error signal is generated by said second control circuit performing a comparison of a current value of said state signal and a previous value of said state signal.

11. The apparatus according to claim 9, wherein said delta-sigma modulation overflow occurs when said first circuit changes a state.

12. The apparatus according to claim 9, wherein (i) said second feedback circuit is implemented as a digital-to-analog converter, (ii) said first control circuit is implemented as a digital-to-time converter, (iii) said second feedback is a gain and (iv) said digital-to-analog converter adjusts said gain in response to said error signal and presents said gain to said digital-to-time converter.

13. The apparatus according to claim 12, wherein said digital-to-time converter uses said gain to calibrate and settle to a value to reduce an amount of said jitter.

14. The apparatus according to claim 1, wherein said first feedback circuit comprises a measurement circuit configured to perform a cycle-to-cycle comparison of said output clock signal.

15. The apparatus according to claim 14, wherein (A) said measurement circuit comprises a gated ring oscillator and (B) slow changes in oscillator frequency are rejected by said gated ring oscillator.

16. The apparatus according to claim 1, wherein said second feedback circuit comprises a digital state machine implementing at least one of (i) a dynamic-element-matching component and (ii) a delta-sigma modulation component.

17. The apparatus according to claim 1, wherein mismatched capacitances in said first control circuit are linearized using at least one of (i) dynamic-element-matching and (ii) scrambling techniques.

18. A method for reducing jitter on a signal, comprising the steps of:
  (A) receiving an input clock signal;
  (B) receiving a configuration signal;
  (C) generating (i) a divided clock signal and (ii) a control signal;
  (D) selecting a number of a plurality of capacitances to engage; and
  (E) generating an output clock signal in response to (i) said control signal and (ii) said divided clock signal, wherein (a) a delay is added to one or more edges of said output clock signal by engaging one or more of a plurality of said capacitances, (b) said number of said capacitances engaged is selected to reduce jitter on said output clock signal, and (c) said capacitances are used each cycle to calibrate said output clock signal, wherein (i) a fractional divider circuit based on a calibrated digital-to-time converter is implemented to (a) receive said input clock signal, (b) receive said configuration signal and (c) generate said divided clock signal and (ii) a jitter reduction circuit is implemented to (a) receive said control signal, (b) receive said divided clock signal and (c) generate said output clock signal.

* * * * *